United States Patent [19]

Ford et al.

[11] Patent Number: 4,853,044
[45] Date of Patent: Aug. 1, 1989

[54] ALLOY SUITABLE FOR MAKING SINGLE CRYSTAL CASTINGS

[75] Inventors: David A. Ford; Anthony D. Hill; Ian R. Pashby, all of Bristol, England

[73] Assignee: Rolls-Royce plc, London, England

[21] Appl. No.: 144,697

[22] Filed: Jan. 13, 1988

Related U.S. Application Data

[63] Continuation of Ser. No. 943,865, Dec. 22, 1986, abandoned, which is a continuation of Ser. No. 679,065, Dec. 6, 1984, abandoned.

[30] Foreign Application Priority Data

Dec. 24, 1983 [GB] United Kingdom ............... 8334476

[51] Int. Cl.$^4$ ............................................. C22F 1/10
[52] U.S. Cl. ........................................ 148/3; 148/162; 148/404; 148/410; 420/447; 420/448
[58] Field of Search ............... 148/404, 162, 410, 3; 420/447, 448

[56] References Cited

U.S. PATENT DOCUMENTS 4,459,160 7/1984 Meetham et al. ............... 148/162

FOREIGN PATENT DOCUMENTS 2105369 3/1983 United Kingdom .

Primary Examiner—R. Dean
Attorney, Agent, or Firm—Oliff & Berridge

[57] ABSTRACT

An alloy suitable for making single crystal castings consists essentially of the following constituents by weight percent:

| | |
|---|---|
| Chromium | 8–15% |
| Aluminum | 5–7% |
| Titanium | 2–5% |
| Niobium | 0.1–2% |
| Molybdenum | 0–7% |
| Tantalum | 1–8% |
| Tungsten | 0–7% |
| Cobalt | 5–15% |
| Vanadium | 0.5–2% |
| Carbon | 0–0.05% |
| Balance Nickel plus impurities. | |

The combined weight of Tungsten, Molybdenum and Tantalum is from 2.5 to 8.0 percent by weight of the total alloy weight and the combinations of Aluminium, Titanium, Niobium, Tantalum and Vanadium are balanced such as to give an alloy volume fraction of between 60 and 75% of gamma prime ($Ni_3(M)$) where M is Aluminium, Titanium, Niobium, Tantalum, Vanadium and also minimum gamma/gamma prime lattice mismatch. The alloy has good high strength characteristics, impact resistance, corrosion and oxidation resistance and has a wide heat treatment window.

8 Claims, 5 Drawing Sheets

ALLOY SUITABLE FOR MAKING SINGLE CRYSTAL CASTINGS

This is a continuation of application Ser. No. 943,865, abandoned filed Dec. 22, 1986 which in turn is a continuation of Ser. No. 679,065 abandoned filed Dec. 6, 1984.

This invention relates to an alloy suitable for making single-crystal castings and to a casting made from such an alloy.

Cast nickel-based alloys and in particular the so-called nickel-based superalloys have been widely used in the past for applications in which resistance to high temperatures is required. Such applications are largely found in the hotter parts of gas turbine engines. It has been found in recent years that an improvement in cast objects for operation in these extreme conditions may be made by casting the objects as single rather than in the conventional multi-crystalline form. In general, single crystal castings have better high temperature lives and strength than their equi-axed, multi-crystalline counterparts.

The nickel-based superalloys currently used represent highly developed formulations which have been specifically designed to make the best of the equi-axed, multicrystalline cast form in which they have been used. When these materials are used in standard form to produce single crystal castings, their properties are compromised by the presence and levels of a number of constituents whose major role is to overcome the deficiencies of a multi-crystalline structure. It is possible, however, to design new alloys which are more accurately tailored to single crystal use.

Alloys which traditionally have been formulated for single crystal use are characterised by their high strength but the majority suffer from a lower ductility than conventional equi-axed cast superalloys, which in turn has an adverse effect upon their impact resistance. Moreover these single crystal alloys are susceptible to casting defects such as freckles and slivers and are difficult to heat treat effectively. In order to obtain the maximum material properties from a single crystal casting, it is necessary to carry out a solution and homogenization heat treatment to refine the metallurgical structure. The temperature at which this heat treatment is carried out must be above the gamma prime solvus of the alloy and below the alloy solidus. This temperature difference is generally referred to as the temperature window of the alloy. For manufacturing reasons the temperature window should be at least 20° C. However conventional single crystal alloys have temperature windows which are inconveniently close to this figure and very few exceed a temperature window of 28° C.

It is an object of the present invention to provide a nickel-based superalloy suitable for making single crystal castings which has high strength, improved castability, good tensile ductility and a wide heat treatment window.

According to the present invention, an alloy suitable for making single-crystal castings consists essentially of the following constituents by weight percent:

| | |
|---|---|
| Chromium | 8–15% |
| Aluminum | 5–7% |
| Titanium | 2–5% |
| Niobium | 0.1–2% |
| Molybdenum | 0–7% |
| Tantalum | 1–8% |
| Tungsten | 0–7% |
| Cobalt | 5–15% |
| Vanadium | 0.5–2% |
| Carbon | 0–0.05% |
| Balance Nickel plus impurities. | | provided that the combined weight of Tungsten, Molybdenum and Tantalum is from 2.5 to 8.0 percent by weight of the total alloy weight and that the combinations of Aluminium, Titanium, Niobium, Tantalum and Vanadium are balanced such as to give an alloy volume fraction of between 60 to 75% of gamma prime ($Ni_3(M)$) where M is Aluminium, Titanium, Niobium, Tantalum, Vanadium, and also minimum gamma/gamma prime lattice mismatch.

The present invention also includes a cast single crystal object made from an alloy falling within the range set out above.

Examples of nickel-based alloys in accordance with the present invention are set out in the table overleaf as C and D. Alloys C & D were manufactured by melting a charge consisting of the listed constituents, in a vacuum furnace, pouring the melt into a suitable mould, and controlling the rate of solidification and conditions of casting to produce a single crystal component. There are numerous well known techniques for casting single crystal alloys that can be employed to cast components using the Alloys of the present invention. The final component had the composition set out in the following table. Alloy A disclosed in British Pat. No. 2105369 is a known high ductility single crystal nickel-based superalloy and alloy B generally known as IN100 is a known equi-axed, multicrystalline nickel-based superalloy.

| Alloy | Co | Cr | Al | W | Mo | Nb | Ta | V | Ti | C | Ni |
|---|---|---|---|---|---|---|---|---|---|---|---|
| A | 15.0 | 10.0 | 5.5 | — | 3.0 | — | — | 1.0 | 4.0 | 0.02 | BAL |
| B | 15.0 | 9.5 | 5.5 | — | 3.0 | — | — | 0.95 | 4.75 | 0.18 | BAL |
| C | 10.0 | 10.0 | 5.8 | 3.3 | 1.6 | 0.8 | 1.6 | 0.8 | 2.5 | 60* | BAL |
| D | 10.0 | 9.0 | 6.0 | 3.0 | 1.5 | 1.0 | 2.0 | 1.0 | 2.5 | 60* | BAL |

*parts per million

It will be appreciated that it is usually desirable to heat treat cast superalloy objects to allow them to develop the optimum properties for use. Alloys in accordance with the present invention are no exception and a suitable solution and homogenization heat treatment is necessary to refine the metallurgical structure of the alloys. In the case of the single crystal alloys A, C and D this entails a solution heat treatment step for heating the alloy to a temperature above the gamma prime solvus of the alloy but below its solidus followed by a homogenization step. This typically means heating the alloy at a temperature above 1250° C. but below the solidus for 1–5 hours followed by 1 hour at 1100° C. and 16 hours at 850° C. In the following tests all of the samples of alloys A, C and D were so heat treated. In the case of alloy B the results quoted are taken from published information on a suitable heat treated alloy B.

As previously stated, the heat treatment windows of single crystal nickel-based superalloys should be as large as possible in order to ensure effective heat treatment under normal manufacturing conditions. In the case of the single crystal alloy C, the solution heat treatment window is from 1245° C. to 1280° C. giving a heat treatment window of 35° C. and in the case of alloy D the heat treatment window is from 1255° C. to 1280° C. giving a heat treatment window of 25° C. It will be seen therefore that the single crystal superalloys C and D in accordance with the present invention have heat treatment windows which are greater than the minimum figure of 20° C. necessary for manufacturing purposes. The actual solution heat treatment temperatures for alloys C and D are 1260° C. and 1265° C. respectively.

Alloys in accordance with the present invention are hardened with gamma prime precipitates of the general form ($Ni_3(M)$) where M is Aluminium, Titanium, Niobium, Tantalum, Vanadium. The combination of elements is balanced to give an alloy volume fraction of between 60 and 75% of gamma prime ($Ni_3(M)$) and minimum gamma/gamma prime lattice mismatch. Alloy C has a gamma prime volume fraction of 62% and Alloy D a volume fraction of 68%. The low lattice mismatch ensures stable gamma prime precipitates at high temperatures, thereby providing high temperature strength. Further enhancement of high temperature strength is obtained by limited refractory element hardening. Thus the combined weight of the refractory elements Tungsten, Molybdenium and Tantalum should be within the range 2.5 to 8 percent by weight of the total alloy weight. By restricting the amount of refractory metal hardening while maintaining high temperature strength with a stable precipitate, alloys in accordance with the present invention are provided which are of equivalent strength to the majority of conventional single crystal alloys but which are more ductile and therefore have superior impact resistance.

Corrosion resistance of alloys in accordance with the present invention is afforded by the presence of from 8 to 15% by weight of chromium. Cobalt is added to the alloys within the range 5 to 15% by weight in order to prevent the formation of deleterious topologically close packed phases and provide additional matrix strength.

Vanadium is present in the range up to 2% by weight in order to provide control over the heat treatment window. Additional control of the heat treatment window is provided by ensuring that the volume percentage of gamma prime precipitate does not exceed 75%.

In tests of alloys in accordance with the present invention, test pieces of alloy C in accordance with the present invention were made up in single crystal form and various of their properties determined and compared with the known single crystal alloy A and the known equi-axed multicrystalline alloy B. The results of these tests are illustrated in the accompanying drawings in which.

Figure 1:
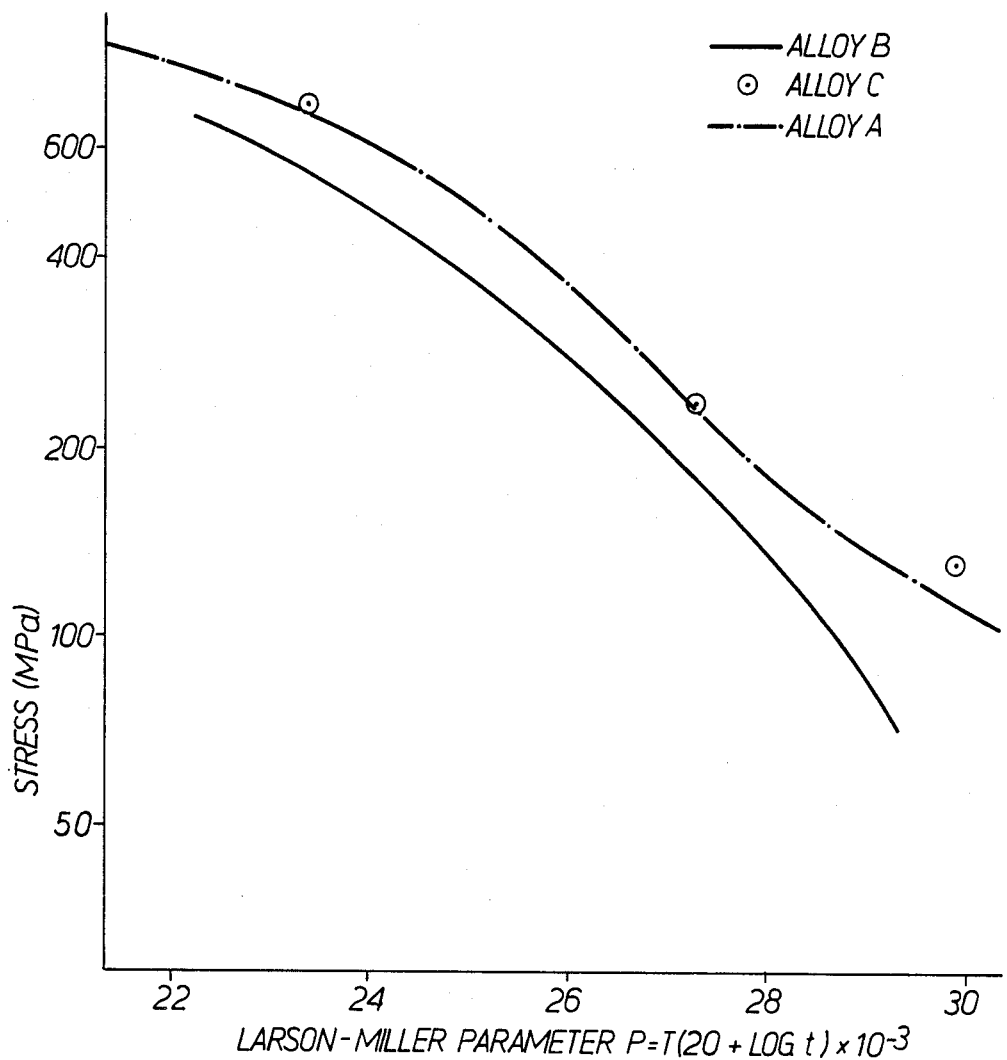
FIG. 1 is a Larson-Miller plot indicating stress-rupture properties.

Referring to FIG. 1, this shows a plot know to metallurgists as a Larson-Miller plot. It shows in graphic form the relationship between stress, on a logarithmic scale, and the Larson-Miller parameter "P" which is the product of the temperature of testing "T" and the sum of the logarithm of the time to failure "t" plus a constant (20 in this case). The parameter is multiplied by a scaling factor ($10^{-3}$ in this case).

This plot forms a convenient way of describing the stress rupture properties of the alloys in that the relationship of the three parameters of time to rupture at a given temperature and stress level are illustrated.

In addition to the parameter P, it will be seen that actual values of temperature for given times to rupture are set out as alternative ordinates in FIG. 1. This enables the physical effect of the parameter to be more easily visualised.

To produce the plot of FIG. 1, the data for alloys A and B was used to produce the broken and unbroken lines respectively while standard stress-rupture tests on the single crystal specimen C were used to produce the individual results indicated by the circled dots. It will be seen that the results for alloys A and C are close and that both alloys comfortably exceed the life of alloy B in all of the test conditions. However, while the low temperature strength of alloy C is similar to that cf Alloy A, it has an improved high temperature strength. In fact the advantage of 1050° C. is 3.4× rupture life which equates to a 27° C. temperature advantage over alloy A.

Figure 2:
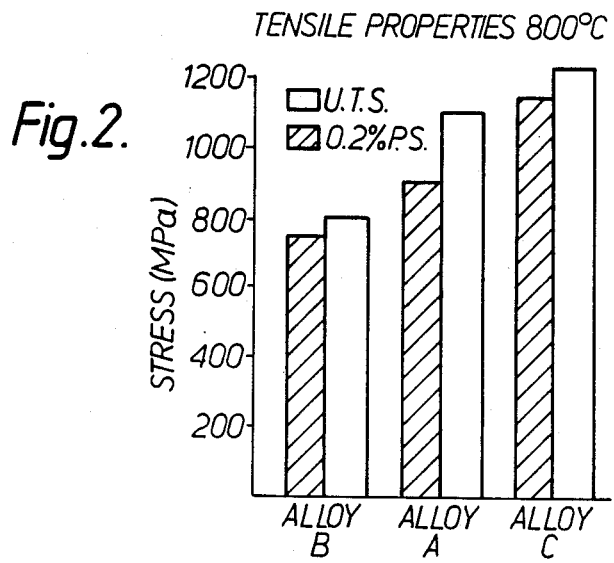
FIG. 2 is a bar chart illustrating tensile properties.

The bar chart of FIG. 2 shows the ultimate tensile strengths of 0.2 proof strength of alloys A, B and C. It will be seen that the results for the single crystal alloys A and C are superior to those for the equiaxed multicrystalline alloy B and that alloy C in accordance with the present invention has superior properties to the known single crystal alloy A. Indeed alloy C has something in the order of a 30% improvement in 0.2% proof strength over alloy A.

Figure 3:
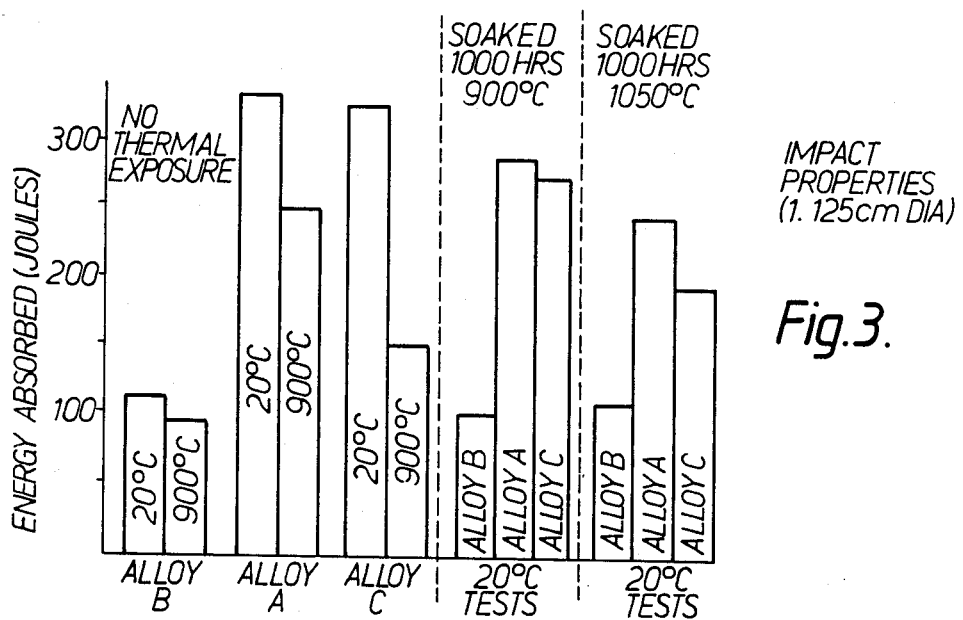
FIG. 3 is a bar chart illustrating impact properties after various pre-treatments.

In FIG. 3, the bar chart shows the respective impact properties of alloys A, B and C determined in a standard test which measures the energy absorbed in fracturing a standard test piece. The tests were carried out at room temperature and at high temperature and the room temperature tests included test pieces soaked at high temperatures for specified periods. It is clear from the results that the single crystal alloys A and C have superior impact properties to the multi-crystalline alloy B in view of their high lives of ductility. The known alloy A has superior impact properties to alloy C in accordance with the present invention. However alloy A is unusual in its ductility properties and generally single crystal alloys have ductility levels which are similar to or less than those of the multicrystalline alloy B. Indeed in 900° C. Charpy tests carried a 0.719 cm diameter test pieces of alloy C and a conventional single crystal alloy, alloy C gave an energy absorbed figure of 60 Joules while the conventional alloy gave a figure of only 25 Joules.

Figure 4:
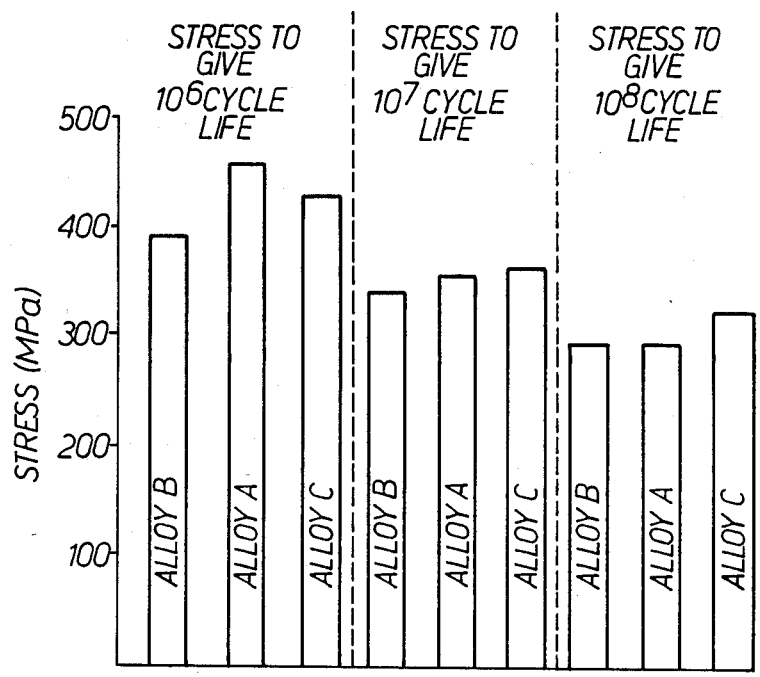
FIG. 4 is a bar chart indicating high cycle fatigue properties.

FIG. 4 shows the results of tests to determine the high cycle fatigue properties of alloys A, B and C. The tests involved repeatedly cycling the stress on a test piece between a maximum and minimum stress level while the test piece was held at a temperature of 800° C. From these results, the stress levels which gave lives of $10^6$, $10^7$ and $10^8$ cycles were determined. It will be seen from the results of the tests that the performance of alloy C in accordance with the present invention was not markedly different from the results for alloys A and B. However the results do indicate the alloy C at least matches up to alloys A and B.

Figure 5:
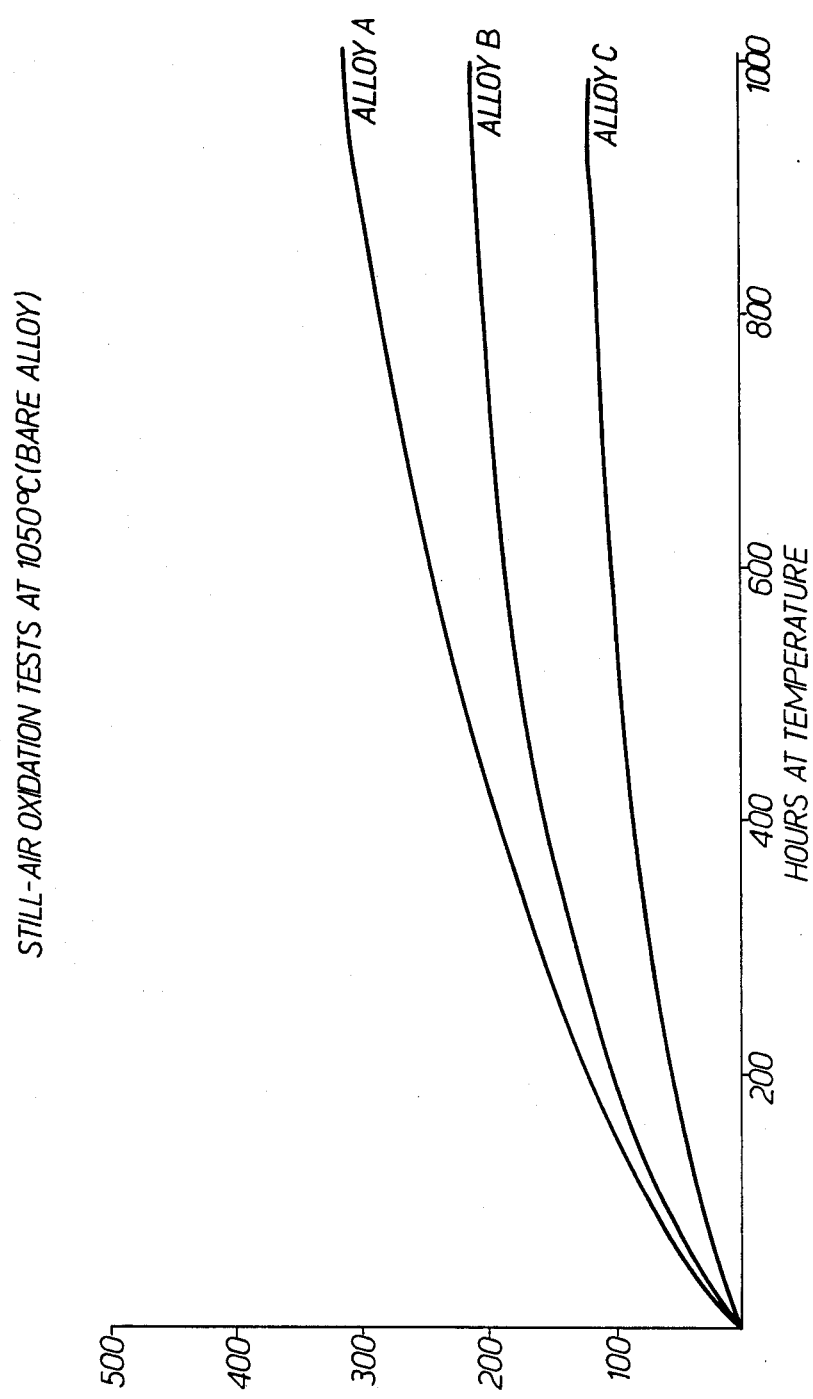
FIG. 5 is a graph illustrating the results of still air oxidation tests.

In FIG. 5 the results are shown of still air oxidation tests on bare alloy samples at a temperature of 1050° C. The tests clearly indicate the alloy C in accordance with the present invention has superior oxidation resistance to the known alloys A and B.

Figure 6:
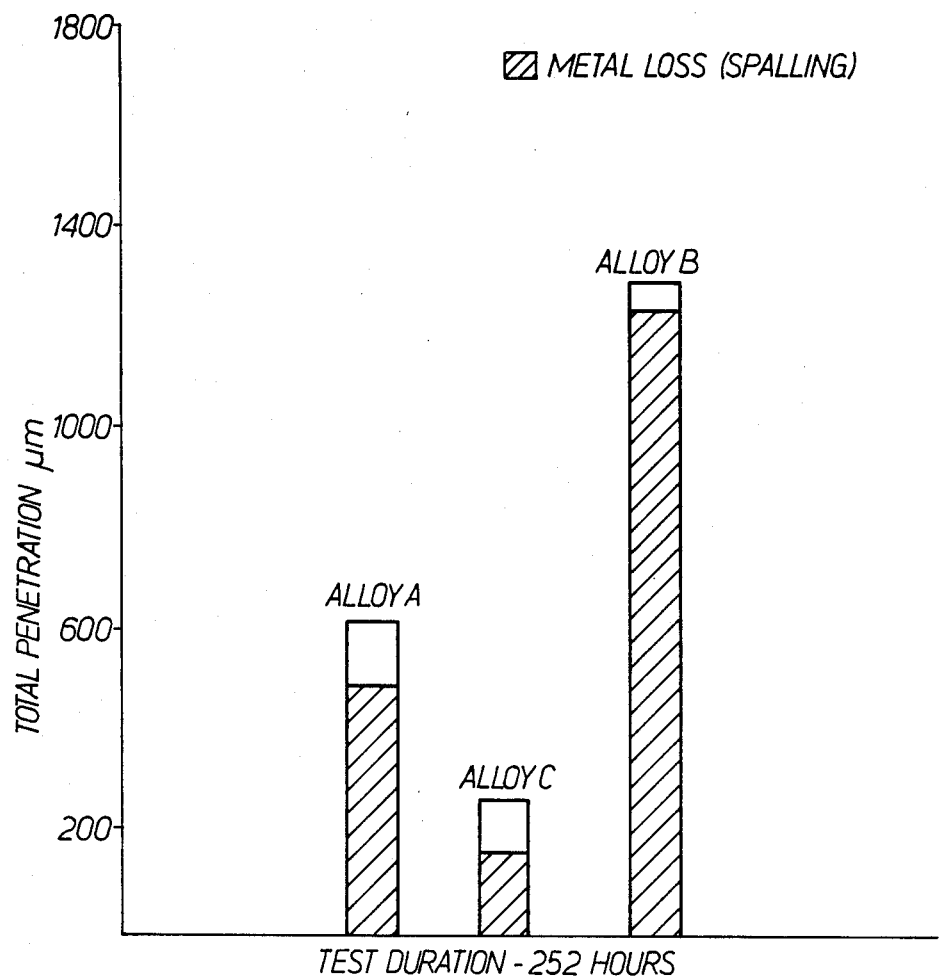
FIG. 6 is a bar chart illustrating the results of salt accelerated furnace corrosion tests.

Finally FIG. 6 shows the results of salt accelerated furnace corrosion tests. The results indicate that the known single crystal alloy A has superior corrosion resistance to the known equi-axed multi-crystalline alloy B. However alloy C in accordance with the present invention has superior corrosion resistance to both of these alloys.

Examination of the cast test pieces of alloy C in accordance with the present invention prior to the tests carried out above revealed that they are resistant to the casting defects known as freckles and slivers. It is believed that this is due to the low level of refractory elements present in the alloy.

It will be seen therefore that alloys in accordance with the present invention have good castability, a wide heat treatment window and have good impact resistance and tensile ductility when compared with existing nickel-based single crystal superalloys. They additionally have improved resistance to corrosion and oxidation.

We claim:

1. A single crystal casting cast from an alloy consisting essentially of, by weight percent:

| | |
|---|---|
| Chromium | 8–15% |
| Aluminum | 5–7% |
| Titanium | 2–5% |
| Niobium | 0.1–2% |
| Molybdenum | 0–7% |
| Tantalum | 1–8% |
| Tungsten | 0–7% |
| Cobalt | 5–15% |
| Vanadium | 0.5–2% |
| Carbon | 0–0.5% |

Balance Nickel plus impurities,
provided that the combined weight of Tungsten, Molybdenum and Tantalum is from 2.5 to 8.0 percent by weight of the total alloy weight and that the combination of Aluminum, Titanium, Niobium, Tantalum and Vanadium are balanced such as to give an alloy volume fraction of between 60 and 75% of gamma prime ($Ni_3(M)$) where M is Aluminum, Titanium, Niobium, Tantalum, Vanadium, and also minimum gamma/gamma prime lattice mismatch.

2. A single crystal casting as claimed in claim 1 consisting essentially of, by weight percent:

| | |
|---|---|
| Chromium | 10.0% |
| Aluminum | 5.8% |
| Titanium | 2.5% |
| Niobium | 0.8% |
| Molybdenum | 1.6% |
| Tantalum | 1.6% |
| Tungsten | 3.3% |
| Cobalt | 10.0% |
| Vanadium | 0.8% |
| Carbon | 0.01% |
| Balance Nickel plus impurities. | |

3. A single crystal casting as claimed in claim 1 consisting essentially of, by weight:

| | |
|---|---|
| Chromium | 9.0% |
| Aluminum | 6.0% |
| Titanium | 2.5% |
| Niobium | 1.0% |
| Molybdenum | 1.5% |
| Tantalum | 2.0% |
| Tungsten | 3.0% |
| Cobalt | 10.0% |
| Vanadium | 1.0% |
| Carbon | 0.01% |
| Balance Nickel plus impurities. | |

4. A method of manufacturing a single crystal having the composition claimed in claim 1, the method comprising the steps of forming a melt having said composition and allowing the melt to solidify while controlling the rate of solidification and conditions of solidification to form a single crystal alloy.

5. A method according to claim 4 wherein the solidified alloy is heat treated by heating the alloy at a temperature between 1250° C. and the alloy solidus for between one and five hours followed by heating the alloy at 1100° C. for one hour and 850° C. for 16 hours.

6. A single crystal casting formed from an alloy claimed in claim 1.

7. A single crystal casing as claimed in claim 1, wherein said single crystal has an average time until failure of 108.2 hours when maintained at a temperature of 850° C. and under a stress of 550 MPa.

8. A single crystal casting as claimed in claim 1, wherein said single crystal has an average time until failure of 119.7 hours when maintained at a temperature of 1050° C. and under a stress of 145 MPa.

* * * * *